United States Patent
Zhou et al.

(10) Patent No.: US 8,728,836 B2
(45) Date of Patent: May 20, 2014

(54) METHOD FOR PREVENTING ELECTROSTATIC BREAKDOWN, METHOD FOR MANUFACTURING ARRAY SUBSTRATE AND DISPLAY SUBSTRATE

(75) Inventors: Weifeng Zhou, Beijing (CN); Jian Guo, Beijing (CN); Xing Ming, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 127 days.

(21) Appl. No.: 13/338,463

(22) Filed: Dec. 28, 2011

(65) Prior Publication Data

US 2012/0168791 A1 Jul. 5, 2012

(30) Foreign Application Priority Data

Dec. 30, 2010 (CN) .......................... 2010 1 0616590

(51) Int. Cl.
*H01L 21/00* (2006.01)
(52) U.S. Cl.
USPC ....... 438/30; 438/140; 438/149; 257/E23.135

(58) Field of Classification Search
USPC .................... 438/30, 149, 140; 257/E23.135
See application file for complete search history.

(56) References Cited

U.S. PATENT DOCUMENTS

| | | | | | |
|---|---|---|---|---|---|
| 5,595,918 | A | * | 1/1997 | Kinzer | 438/138 |
| 5,798,534 | A | * | 8/1998 | Young | 257/59 |
| 6,313,900 | B1 | * | 11/2001 | Kawata | 349/153 |
| 2006/0014333 | A1 | * | 1/2006 | Barbe et al. | 438/151 |

* cited by examiner

*Primary Examiner* — Michelle Mandala
(74) *Attorney, Agent, or Firm* — Ladas & Parry LLP

(57) ABSTRACT

An embodiment of the disclosed technology provides a method for preventing electrostatic breakdown during the manufacturing process of the array substrate. The method comprises: when forming a conductive pattern of a substrate, connecting conductive lines for forming the conductive pattern with a closed conductive ring on a same layer as the conductive lines in a peripheral region of the substrate, and wherein when electrostatic charges are generated over the metal line, the electrostatic charges are led to the closed conductive ring.

19 Claims, 5 Drawing Sheets

When forming a conductive pattern of a substrate, connecting a metal for forming the conductive pattern with a closed conductive ring in a periphery region of the substrate When electrostatic is generated in the metal line, the electrostatic is led to the closed conductive ring When forming a conductive pattern of a substrate, connecting a metal for forming the conductive pattern with a closed conductive ring in a periphery region of the substrate When electrostatic is generated in the metal line, the electrostatic is led to the closed conductive ring

US 8,728,836 B2

METHOD FOR PREVENTING ELECTROSTATIC BREAKDOWN, METHOD FOR MANUFACTURING ARRAY SUBSTRATE AND DISPLAY SUBSTRATE

BACKGROUND

Embodiments of the disclosed technology relates to a method for preventing electrostatic breakdown, a method for manufacturing array substrate and a display substrate.

Liquid crystal displays (LCDs) are currently commonly-used flat panel displays, among which thin film transistor liquid crystal displays (TFT-LCDs) are main products.

Electrostatic breakdown is a very common failure mode in electronic industry. Electrostatic breakdown is a phenomenon in which charges are concentrated on one part of a device and generate electrostatic discharge. Electrostatic breakdown may lead to serious damage to a TFT-LCD device and thus should be avoided in the manufacturing process of the TFT-LCD device.

The conventional method for preventing electrostatic breakdown in the TFT-LCD industry is to prepare an electrostatic ring. An electrostatic ring is based on the principle that electrostatic charges tend to distribute along the outer edge of a conductor. A ring circuit is provided along the peripheral of the array substrate of a single liquid crystal panel, and gate lines, common electrode lines and data lines are connected to the electrostatic ring through a TFT structure in which source or drain is connected with gate. Thus, when there is excessive amount of electrostatic charges over any conductive line among the gate lines, the common electrode lines and the data lines, the TFT device connected between the line and the electrostatic ring may be automatically turned on and the electrostatic charges are led to the electrostatic ring, thereby the liquid crystal panel is protected.

However, the TFT structures, connecting with the gate lines, the common electrode lines and the data lines, on the electrostatic ring function until the whole array substrate has been manufactured. Therefore, the electrostatic ring cannot perform the function of preventing electrostatic breakdown during the manufacturing process of the array substrate. However, during the manufacturing process of the array substrate, it is very likely for the electrostatic charges to arise in the chemical vapor deposition (CVD) process and the dry etching process and thus generate electrostatic breakdown, the product yield may be reduced.

SUMMARY

The embodiments of the disclosed technology provide a method for preventing electrostatic breakdown, a method for manufacturing an array substrate and a display substrate, so as to prevent electrostatic breakdown during manufacturing process of an array substrate.

An embodiment of the disclosed technology provides a method for preventing electrostatic breakdown, which comprises: when forming a conductive pattern of a substrate, connecting conductive lines for forming the conductive pattern with a closed conductive ring on a same layer as the conductive lines in a peripheral region of the substrate, wherein when electrostatic charges are generated over the metal lines, the electrostatic charges are led to the closed conductive ring.

Another embodiment of the disclosed technology provides a method for manufacturing an array substrate, which comprises a step of forming a conductive pattern and insulation layers on a base substrate, wherein the step of forming the conductive pattern comprises: forming a closed conductive ring on a same layer as conductive lines for forming the conductive pattern in a peripheral region of the base substrate, and connecting the conductive lines with the closed conductive ring.

Further another embodiment of the disclosed technology provides a display substrate which comprises: a base substrate; conductive patterns and insulation layers formed on the base substrate, and the conductive patterns comprise: gate lines and data lines; and a closed conductive ring in a peripheral region of the base substrate, wherein the gate lines or data lines are electrically connected with the closed conductive ring.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The embodiments of the disclosed technology will become more fully understood from the detailed description given hereinafter and the accompanying drawings which are given by way of illustration only, and thus are not limitative of the disclosed technology and wherein.

DETAILED DESCRIPTION

Embodiments of the disclosed technology will be described clearly and completely hereafter in connection with the accompanying drawings in order to make the objective, technical solution and advantages of the embodiments of the disclosed technology more clear. It is obvious that only a part of the embodiments, not all of the embodiments, are described. Based on the embodiments of the disclosed technology, all other embodiments obtained by those skilled in the art without any inventive work are intended to be included within the scope of the disclosed technology defined by the claims.

Embodiment 1

Figure 1:
FIG. 1 is a flow chart of the method for preventing electrostatic breakdown of an array substrate provided by embodiment 1 of the disclosed technology.

FIG. 1 is a flow chart of the method for preventing electrostatic breakdown of an array substrate provided by embodiment 1 of the disclosed technology. As shown in FIG. 1, the method comprises the following steps.

Step 101: when forming conductive patterns of the substrate, connecting the metal lines for forming the conductive patterns with a closed conductive ring in the peripheral region of the substrate; and Step 102: when electrostatic charges are generated over the metal lines, leading the electrostatic charges to the closed conductive ring.

Based on the principle that electrostatic charges tend to distribute along the outer edge of a conductor, the embodiment of the disclosed technology provides a method for manufacturing a substrate, when forming the conductive patterns of the substrate, connecting the metal lines for forming the conductive patterns with the closed conductive ring in the peripheral region of the substrate, so that during the manufacturing process of the substrate, if electrostatic charges are generated over the metal lines, then the electrostatic charges can be led to the closed conductive ring, and the problem of electrostatic breakdown during the manufacturing process of the substrate can be effectively prevented. Other conductive lines other than metal lines can be formed in the embodiments of the disclosed technology.

Figure 2:
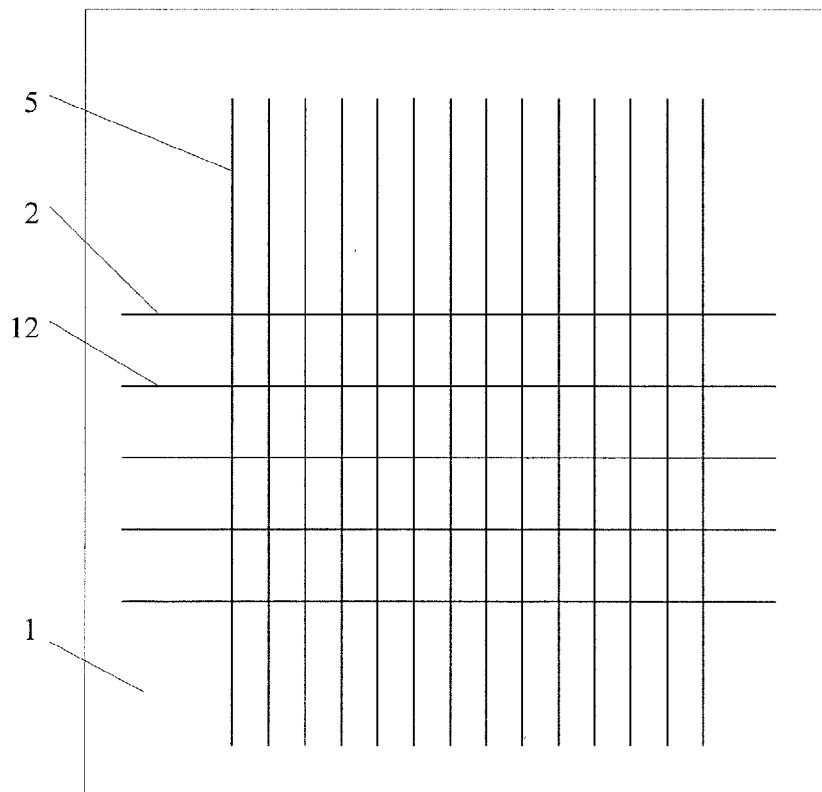
FIG. 2 is a schematic diagram of the distribution of the conductive pattern on the substrate provided by an embodiment of the disclosed technology.

FIG. 2 shows the schematic diagram of the distribution of the conductive patterns on the substrate provided by the embodiment. Forming the conductive patterns of the substrate may comprise but not limit to forming one or more of the following conductive lines on a base substrate 1: gate lines 2 and common electrode lines 12 provided horizontally and data lines 5 provided vertically. The common electrode lines 12 may be formed on the same layer as the gate lines 2 thus parallel to the gate lines, or may be formed on the same layer as the date line 5 thus parallel to the data lines. For example, a gate insulation layer and an active layer are formed between the gate line layer and the date line layer.

Figure 3:
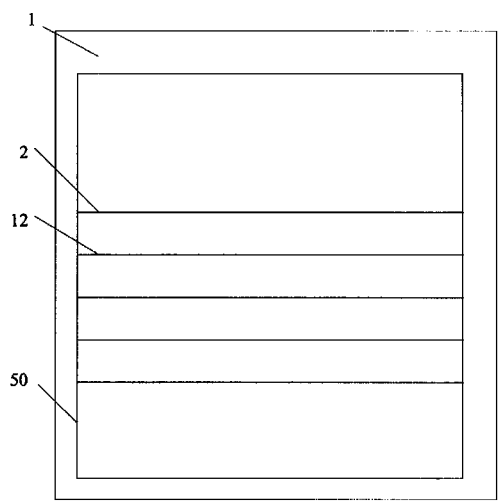
FIG. 3 is a top structure view of the substrate after the gate lines, the common electrode lines and the first closed conductive ring are completed according to an embodiment of the disclosed technology.

FIG. 3 is a top structure view of the substrate after the gate lines, the common electrode lines and a first closed conductive ring are completed according to the embodiment of the disclosed technology. When forming the gate line layer, the first closed conductive ring 50 can be provided in the peripheral region (such as an interface region) of the substrate and connect the all or part of the gate lines 2 with the first closed conductive ring 50. When the common electrode lines 12 are formed on the same layer of the gate lines 2, for example the all or part of the common electrode lines 12 are connected with the first closed conductive ring 50. After the resultant structure of the gate line layer is completed, if electrostatic discharges are generated during deposition, photolithography and etching process for a gate insulation layer and a passivation layer, the electrostatic charges can be led to the first closed conductive ring 50 and thus electrostatic breakdown within the liquid crystal panel can be effectively prevented.

Figure 4:
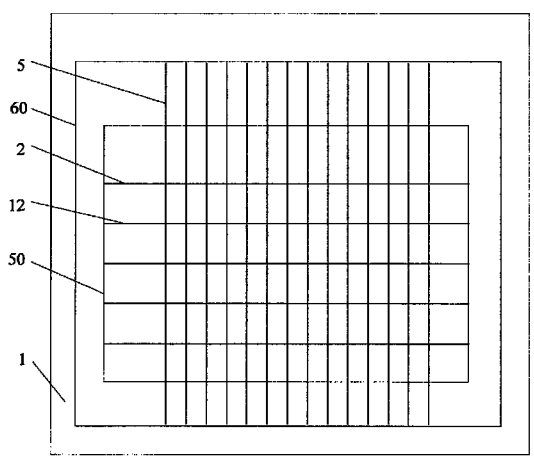
FIG. 4 is a top structure view of the substrate after the date line and the second closed conductive ring are completed on the structure of FIG. 3.

FIG. 4 is a top structure view of the substrate after the date lines and a second closed conductive ring are completed on the structure of FIG. 3. When forming the date line layer, the second closed conductive 60 can be provided in the peripheral region (such as an interface region) of the substrate and connect the all or part of the data lines 5 with the second closed conductive ring 60. When the common electrode lines 12 are formed on the same layer of the data lines 5, for example the all or part of the common electrode lines 12 are connected with the second closed conductive ring 60. After the resultant structure of the data line layer is completed, electrostatic charges which are generated during dry etching of the gate insulation layer and the active layer and the deposition, photolithography and etching process of the passivation layer can be led to the second closed conductive ring 60, therefore effectively preventing electrostatic breakdown within the liquid crystal panel.

The first and second closed conductive rings 50 and 60 may be specifically formed conductive lines on the base substrate 1, or can be the existing closed metal line on the base substrate 1 such as a glass detecting signal line on the base substrate 1. The glass detecting signal line is an open loop conductive line surrounding the outermost edge of the base substrate for detecting whether the glass is broken or not. The entire glass detecting signal line can be used as the closed conductive ring of the present embodiment by connecting the disconnection point (signal leads) of the glass detecting signal line according to the method of the disclosed technology.

Embodiment 2

Embodiment of the disclosed technology provides a method for manufacturing an array substrate, wherein the method may comprise the step of forming conductive patterns and insulation layers on a base substrate.

Date lines, gate lines, pixel electrodes and gate electrodes, source electrodes, drain electrodes and active layers of the TFTs are the examples of conductive patterns. To keep each conductive patterns insulated from each other, conductive patterns provided on the same layer can be spaced apart from each other, and conductive patterns provided on different layers can be insulated from each other by an interposed insulation layer. For example, the gate lines and the gate electrodes may be covered by a gate insulation layer to be insulated from the TFTs and the date lines; the TFTs and the date lines may be covered by a passivation layer to be insulated from the pixel electrodes; and the pixel electrodes may be connected with the drain electrodes through passivation layer via holes.

According to the manufacturing method of the array substrate of the embodiment, the step of forming conductive pattern may comprise at least the following steps.

A. Forming a first closed conductive ring 50 on the same layer as the gate lines 2 in the peripheral region of the base substrate 1, and connecting the gate lines 2 with the first closed conductive ring 50; and/or B. Forming a second closed conductive ring 60 on the same layer as the data lines 5 in the peripheral region of the base substrate 1, and connecting the data lines 5 with the second closed conductive ring 60.

Based on the principle that electrostatic charges tend to distribute along the outer edge of a conductor, the embodiment of the disclosed technology provides a method for manufacturing a substrate, when forming conductive patterns of the substrate, connecting the metal lines for forming the conductive pattern with a closed conductive ring in the peripheral region of the substrate, so that during the manufacturing process of the substrate, if electrostatic charges are generated over the metal lines, then the electrostatic can be led to the closed conductive ring, and the problem of electrostatic breakdown during the manufacturing process of the substrate can be effectively prevented. Other conductive lines other than metal lines can be formed in the embodiments of the disclosed technology.

Furthermore, the step of forming conductive pattern may further comprise the following steps:

C, connecting the common electrode lines 12 with the first or second closed conductive ring 50 or 60.

When the common electrode lines 12 are formed on the same layer as the gate lines 2, the common electrode lines 12 are connected with the first closed conductive ring 50. When the common electrode lines 12 are formed on the same layer as the data lines 5, the common electrode lines 12 are connected with the second closed conductive ring 60.

Considering the fact that in an existing substrate product, for the test or other purposes, all of the gate lines 2, date lines 5, common electrode lines 12 are connected to several electrodes or classified based on certain rules (such as odd and even lines, or R, G and B pixels, etc.,) and connected to several electrodes. For these products, above-mentioned electrodes can be connected with the closed conductive ring on the same layer, and additional wires are not necessary.

In order to complete the array substrate, the method may further comprise the following steps:

D. Disconnecting the connection between the gate lines 2 and the first closed conductive ring 50; and E. Disconnecting the connection between the date lines 5 and the second closed conductive ring 60.

Steps D and E can be performed sequentially or simultaneously. The order described herein is not intent to limit the order between the steps D and E.

Step D may be performed in various ways.

First: Cutting off the connection between the gate lines 2 and the first closed conductive ring 50 by a laser. This method just cuts off the connection and will not cause damages to the base substrate 1.

Second: Cutting off the connection between the gate lines 2 and the first closed conductive ring 50 in the cutting step of a cell-forming process. This method cuts the base substrate 1 (mother substrate) into several liquid crystal panels and the connecting lines between panels are cut accordingly.

A third method will be explained by referring to FIGS. 5a through 5d. FIG. 5a through 5d are sectional side views of the substrate when the connection between the gate lines and the first closed conductive ring is disconnected.

Figure 5A:
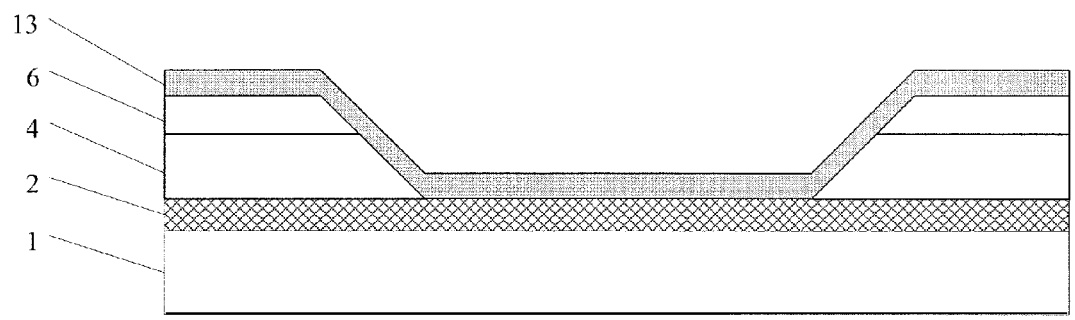
FIG. 5a through 5d are sectional side views of the substrate when the connection between the gate line and the first closed conductive ring is disconnected.

As shown in FIG. 5a, a via hole is formed at the location of the gate line 2 to be cut, so that the location to be cut is exposed through the via hole, and a transparent conductive layer such as indium tin oxide (ITO) layer 13 is formed.

Figure 5B:
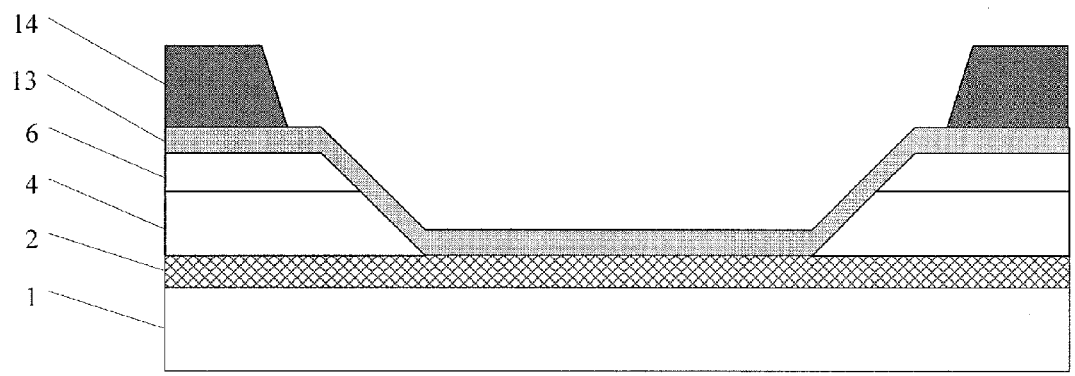

As shown in FIG. 5b, forming photoresist 14 and removing part of the photoresist 14 over the via hole.

Figure 5C:
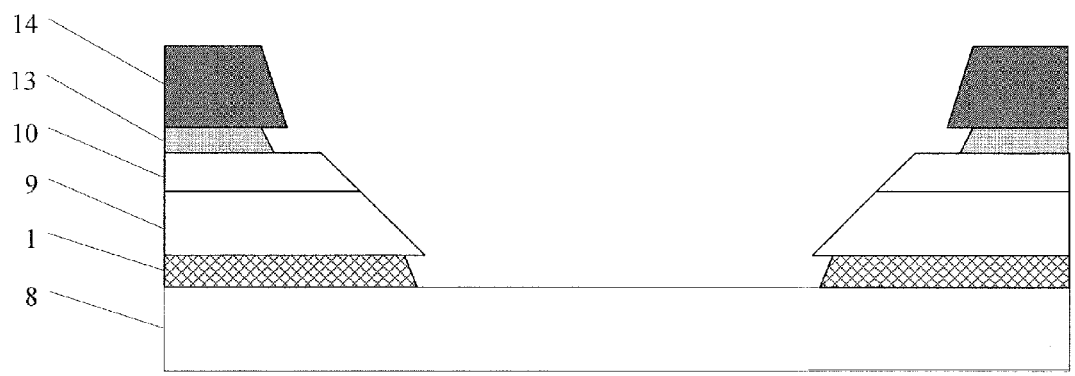

As shown in FIG. 5c, removing the ITO layer at the location of the via hole and the underlying gate line layer by etching with an etching solution which can etch away the materials of the ITO layer, the gate line layer and the data line layer, so that the gate line 2 is cut at the location of the via hole.

The main reasons of the uneven etched shape as shown in FIGS. 5a through 5d include that the etching solution has different etching rate for different metal materials.

Figure 5D:
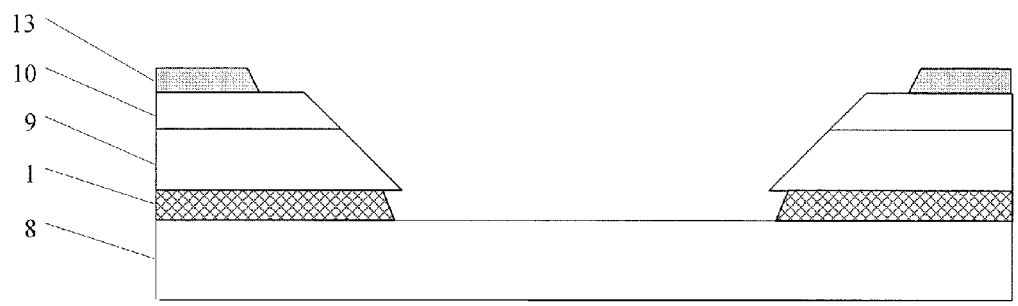

As shown in FIG. 5d, removing the photoresist 14 from the substrate.

Step E can be performed in various ways.

First: Cutting the connection between the data lines 5 and the second closed conductive ring 60 by a laser.

Second: Cutting the connection between the data lines 5 and the second closed conductive ring 60 in the cutting step of a cell-forming process.

The third method will be explained by referring to FIGS. 6a through 6d. FIG. 6a through 6d are sectional side views of the substrate when the connection between the data lines and the second closed conductive ring is disconnected.

Figure 6A:
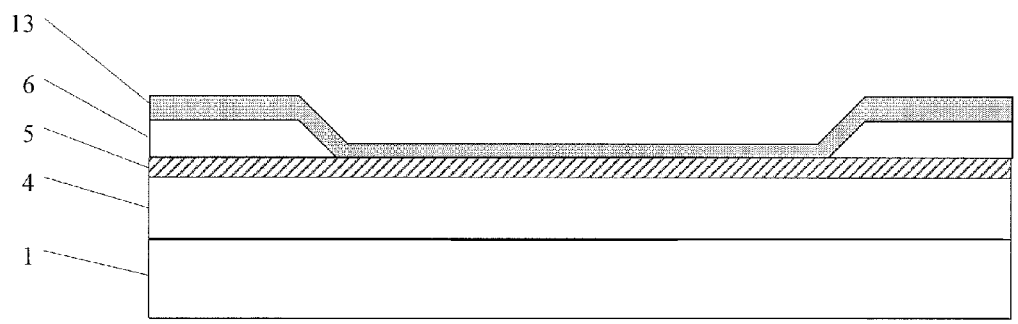
FIGS. 6a through 6d are sectional side views of the substrate when the connection between the data line and the second closed conductive ring is disconnected.

As shown in FIG. 6a, a via hole is formed at the location of the data line 5 to be cut, so that the location to be cut is exposed through the via hole, and a transparent conductive layer such as a ITO layer 13 is formed.

Figure 6B:
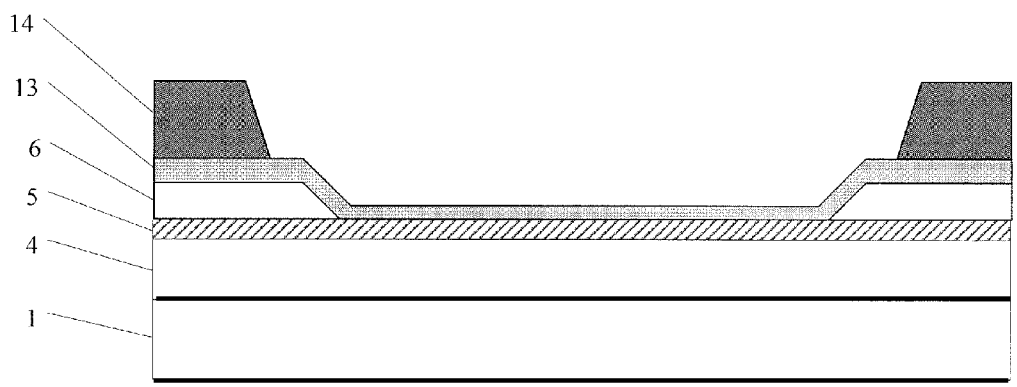

As shown in FIG. 6b, forming photoresist 14 and removing the part of photoresist 14 over the via hole.

Figure 6C:
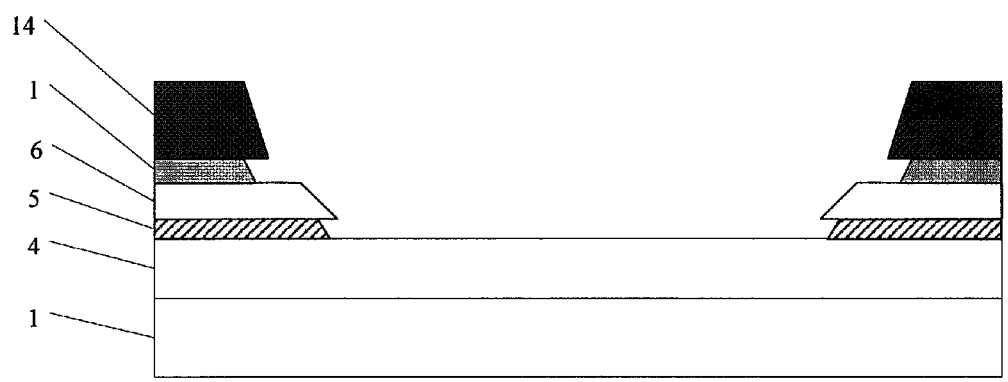

As shown in FIG. 6c, removing the ITO layer at the location of the via hole and the underlying data line layer by etching with an etching solution which can etch materials of the ITO layer, the gate line layer and the data line layer, so that the data line 5 is cut at the location of the via hole.

The main reasons of the uneven etched shape shown as FIGS. 6a through 6d include that the etching solution has different etching rate for different metal materials.

Figure 6D:
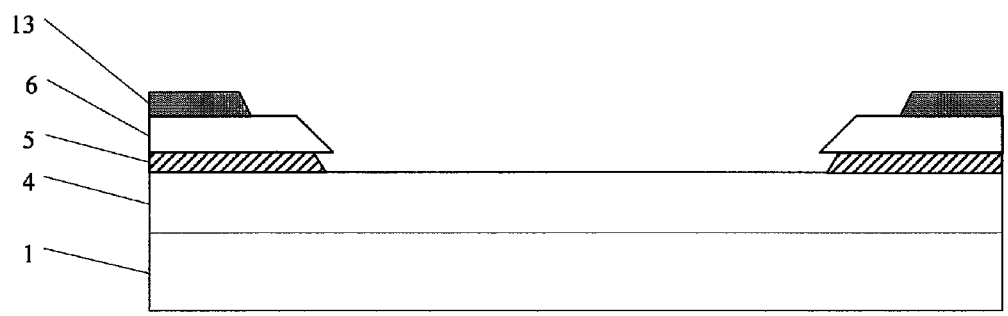

As shown in FIG. 6d, removing the photoresist 14 from the substrate.

Based on the principle that electrostatic charges tend to distribute along the outer edge of a conductor, the embodiment of the disclosed technology provides a method for manufacturing a substrate, when forming the gate lines/data lines of the substrate, connecting the gate lines/data lines with a closed conductive ring in the peripheral region of the substrate, so that during the manufacturing process of the substrate, if electrostatic charges are generated over the metal lines, then the electrostatic charges can be led to the closed conductive ring, and the problem of electrostatic breakdown during the manufacturing process of the substrate can be effectively prevented. Meanwhile, in order to complete the manufacturing of the substrate, the connection between the gate lines/data lines with the closed conductive ring will cuffed, so that the substrate can be used normally. Other conductive lines other than metal lines can be formed in the embodiments of the disclosed technology.

Embodiment 3

This embodiment of the disclosed technology provides a display substrate, the display substrate is an intermediate product formed in the manufacturing process of the array substrate according to the above-mentioned embodiment. According to the above-mentioned embodiment, the display substrate comprises a base substrate; conductive patterns and insulation layers are formed on the base substrate; the conductive patterns may comprise gate lines and data lines; a first closed conductive ring and/or a second closed conductive ring are formed in the peripheral region of the base substrate. The first closed conductive ring is provided on the same layer as the gate lines, and the second closed conductive ring is provided on the same layer as the data lines. The gate lines electrically are connected with the first closed conductive ring, and the data lines electrically are connected with the second closed conductive ring.

The embodiment of the disclosed technology provides a display substrate. As an intermediate product formed in the manufacturing process of the array substrate, the display substrate can lead the electrostatic charges generated during the manufacturing process of an array substrate to the first closed conductive ring and/or the second closed conductive ring, so as to prevent the electrostatic breakdown occurred in manufacturing of the substrate.

Embodiment 4

Embodiment 4 of the disclosed technology provides a method for manufacturing a liquid crystal display panel. The method comprises the following steps.

Step 701: forming a display substrate having TFT structures on a base substrate, wherein gate lines and data lines are formed on the base substrate, a first closed conductive ring on the same layer as the gate lines is formed in the peripheral region of the base substrate, and the gate lines electrically are connected with the first closed conductive ring; and/or forming a second closed conductive ring on the same layer as the data lines in the peripheral region of the base substrate, wherein the data lines electrically are connected with the second closed conductive ring.

Step 702: after the display substrate is completed, disconnecting the connection between the gate lines and the first closed conductive ring and/or the connection between the data lines and the second closed conductive ring.

Step 703: assembling an upper substrate with the display substrate to form a liquid display panel.

The upper substrate may be a color filter substrate, which is combined with the array substrate after cutting to form a cell as a liquid display panel; or if the array substrate comprises color filter structure, the upper substrate can have no color filter structure any more.

Based on the principle that electrostatic charges tend to distribute along the outer edge of a conductor, the embodiment of the disclosed technology provides a method for manufacturing a substrate, when forming the gate lines/data lines of the substrate, connecting the gate lines/data lines with a closed conductive ring in the peripheral region of the substrate, so that during the manufacturing process of the substrate, if electrostatic charges are generated over the metal lines, then the electrostatic charges can be led to the closed conductive ring, and the problem of electrostatic breakdown during the manufacturing process of the substrate can be effectively prevented. Meanwhile, before the manufacturing of the substrate is completed, the connection between the gate lines/data lines with the closed conductive ring is cut off, so that the substrate can be used normally then. Other conductive lines other than metal lines can be formed in the embodiments of the disclosed technology.

It should be explained finally that the above embodiments are only used to explain the disclosed technology and not intended to limit the technical solutions of the disclosed technology. Although the disclosed technology is described in detail with reference to the forgoing embodiments, those with ordinary skills in the art should understand modifications, substitutions or variations can be conducted to the described embodiments. All such modifications, substitutions or variations will not make the nature of the corresponding technical solution depart from the spirit and scope of the technical solution of various embodiments of the disclosed technology.

What is claimed is:

1. A method for preventing electrostatic breakdown, comprising:
when forming a conductive pattern of a substrate, directly connecting conductive lines for forming the conductive pattern with a closed conductive ring on a same layer as the conductive lines in a peripheral region of the substrate, wherein when electrostatic charges are generated over the conductive lines, the electrostatic charges are led to the closed conductive ring.

2. The method for preventing electrostatic breakdown according to claim 1, wherein the conductive lines comprise gate lines and the closed conductive ring comprises a first closed conductive ring.

3. The method for preventing electrostatic breakdown according to claim 1, wherein the conductive lines comprise data lines and the closed conductive ring comprises a second closed conductive ring.

4. The method for preventing electrostatic breakdown according to claim 2, wherein directly connecting the conductive lines for forming the conductive pattern with the closed conductive ring in the peripheral region of the substrate further comprises:
forming common electrode lines on the same layer as the gate lines and directly connecting the common electrode lines with the first closed conductive ring.

5. The method for preventing electrostatic breakdown according to claim 3, wherein directly connecting the conductive lines for forming the conductive pattern with the closed conductive ring in the peripheral region of the substrate further comprises:
forming common electrode lines on the same layer as the data lines and directly connecting the common electrode lines with the second closed conductive ring.

6. The method for preventing electrostatic breakdown according to claim 3, wherein the conductive lines further comprise data lines and the closed conductive ring further comprises a second closed conductive ring, and
wherein the gate lines are directly connected with the first closed conductive ring, and the data lines are directly connected with the second closed conductive ring.

7. The method for preventing electrostatic breakdown according to claim 6, wherein directly connecting the conductive lines for forming the conductive pattern with the closed conductive ring in the peripheral region of the substrate further comprises:
forming common electrode lines on the same layer as the gate lines or the data lines and directly connecting the common electrode lines with the first closed conductive ring or the second closed conductive ring accordingly.

8. A method for manufacturing an array substrate, comprising a step of forming a conductive pattern and insulation layers on a base substrate, wherein the step of forming the conductive pattern comprises:
forming a closed conductive ring on a same layer as conductive lines for forming the conductive pattern in a peripheral region of the base substrate, and directly connecting the conductive lines with the closed conductive ring.

9. The method for manufacturing the array substrate according to claim 8, wherein the conductive lines comprise gate lines and the closed conductive ring comprises a first closed conductive ring.

10. The method for manufacturing the array substrate according to claim 9, further comprising:
forming common electrode lines on the same layer as the gate lines and directly connecting the common electrode lines with the first closed conductive ring.

11. The method for manufacturing the array substrate according to claim 9, further comprising:
disconnecting a connection between the gate lines and the first closed conductive ring.

12. The method for manufacturing the array substrate according to claim 10, further comprising:
disconnecting a connection between the gate lines and the first closed conductive ring and that between the common electrode lines and the first closed conductive ring.

13. The method for manufacturing the array substrate according to claim 8, wherein the conductive lines comprise data lines and the closed conductive ring comprises a second closed conductive ring.

14. The method for manufacturing the array substrate according to claim 13, further comprising:
forming common electrode lines on the same layer as the data lines and directly connecting the common electrode lines with the second closed conductive ring.

15. The method for manufacturing the array substrate according to claim 13, further comprising:
disconnecting a connection between the gate lines and the second closed conductive ring.

16. The method for manufacturing the array substrate according to claim 14, further comprising:
    disconnecting a connection between the data lines and the second closed conductive ring and that between the common electrode lines and the second closed conductive ring.

17. The method for manufacturing the array substrate according to claim 9, wherein the conductive lines further comprise data lines and the closed conductive ring further comprises a second closed conductive ring, and
    wherein the gate lines are directly connected with the first closed conductive ring, and the data lines are directly connected with the second closed conductive ring.

18. The method for manufacturing the array substrate according to claim 17, further comprising:
    forming common electrode lines on the same layer as the gate lines or the data lines and directly connecting the common electrode lines with the first closed conductive ring or the second closed conductive ring accordingly.

19. The method for manufacturing the array substrate according to claim 18, further comprising:
    disconnecting a connection between the gate lines and the first closed conductive ring and that between the data lines and the second closed conductive ring.

\* \* \* \* \*